(12) United States Patent
Kruijswijk

(10) Patent No.: US 7,646,468 B2
(45) Date of Patent: Jan. 12, 2010

(54) LITHOGRAPHIC PROCESSING CELL AND DEVICE MANUFACTURING METHOD

(75) Inventor: Stefan Geerte Kruijswijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 467 days.

(21) Appl. No.: 11/396,915

(22) Filed: Apr. 4, 2006

(65) Prior Publication Data

US 2007/0229828 A1  Oct. 4, 2007

(51) Int. Cl.
G03B 27/52 (2006.01)
H01L 21/302 (2006.01)

(52) U.S. Cl. .......................... 355/53; 438/689

(58) Field of Classification Search ............... 355/27, 355/53; 396/611; 438/689, 708
See application file for complete search history.

(56) References Cited

U.S. PATENT DOCUMENTS

| | | | |
|---|---|---|---|
| 6,548,347 B2 | 4/2003 | Juengling | |
| 6,720,256 B1 | 4/2004 | Wu et al. | |
| 6,867,116 B1 | 3/2005 | Chung | 438/551 |
| 6,974,549 B2 * | 12/2005 | Ohgaki | 216/51 |
| 2003/0006410 A1 * | 1/2003 | Doyle | 257/20 |
| 2005/0137734 A1 * | 6/2005 | Nieuwelaar et al. | 700/100 |
| 2007/0229792 A1 | 10/2007 | Kruijswijk et al. | |

FOREIGN PATENT DOCUMENTS

JP 2004-281835 10/2004

OTHER PUBLICATIONS

A machine translation of JP-2004 281835 A.*
First Non-Final Rejection mailed Sep. 5, 2008 for U.S. Appl. No. 11/731,024, filed Mar. 30, 2007, 11 pgs.
Second Non-Final Rejection mailed Mar. 9, 2009 for U.S. Appl. No. 11/731,024, filed Mar. 30, 2007, 9 pgs.

* cited by examiner

*Primary Examiner*—Edward J Glick
*Assistant Examiner*—Mesfin T Asfaw
(74) *Attorney, Agent, or Firm*—Sterne, Kessler, Goldstein & Fox P.L.L.C.

(57) ABSTRACT

A double processing technique for device manufacture includes performing a first patterning step to form apertures in a resist layer which apertures are filled before the first resist layer is stripped and replaced by a second resist layer to be used in the second exposure.

20 Claims, 2 Drawing Sheets

LITHOGRAPHIC PROCESSING CELL AND DEVICE MANUFACTURING METHOD

FIELD

The present invention relates to a lithographic processing cell, including a lithographic apparatus and a process apparatus, and to one or more device manufacturing methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"—direction) while synchronously scanning the substrate parallel or anti-parallel to this direction. It is also possible to transfer the pattern from the patterning device to the substrate by imprinting the pattern onto the substrate.

In a device manufacturing method using projection lithographic apparatus, the minimum feature size, often referred to as critical dimension (CD), is determined by the wavelength ($\lambda$) of the exposure radiation and the numeric aperture (NA) of the projection system. Various techniques have been developed to reduce CD and these are commonly combined into a factor known as $k_1$ so that $CD=k_1 \cdot \lambda/NA$. With current technology, it may not be possible to image a feature smaller than determined by a $k_1$ factor of about 0.25 in a single exposure-develop-process cycle. However a smaller feature may be imaged with a double exposure and double process technique.

In a double exposure technique, a single layer of resist is exposed twice—either with two different patterns or with the same pattern but with a positional offset—before being developed. In a double process technique, a first layer of resist is exposed and developed and then the substrate is etched, transferring the pattern to the substrate, then a second layer of resist is applied to the substrate. The second layer is then exposed, developed and the substrate etched so that the final pattern in the substrate is produced by the combination of the two etch steps. A double process technique may be used to create a wide variety of useful structures but may be slow, taking one or two days because of the etch steps and the need to remove the substrate from the lithocell—comprising a lithographic apparatus and process apparatus such as a spin coater, developer and bake & chill plates—to perform the etch steps. Although a double exposure technique may be performed much more quickly, the range of structures it may be used for is more limited.

SUMMARY

It is therefore desirable, for example, to provide an improved method and apparatus capable of creating structures equivalent to a $k_1$ value of less than or equal to 0.25.

According to an aspect of the invention, there is provided a lithographic cell, comprising:
a lithographic apparatus;
a plurality of process apparatus, the plurality of process apparatus comprising a fill apparatus, or a strip apparatus, or both a fill apparatus and a strip apparatus; and
a control unit configured to control both the lithographic apparatus and the process apparatus.

According to an aspect of the invention, a device manufacturing method using a lithographic apparatus, the method comprising:
filling first apertures in a first pattern in a first layer of radiation-sensitive material of a substrate with a first filler;
removing the first layer of radiation-sensitive material without removing the first filler;
applying a second layer of radiation-sensitive material around the first filler;
exposing and developing the second layer of radiation-sensitive material to form second apertures in a second pattern therein;
filling the second apertures with a second filler; and
removing the second layer of radiation-sensitive material without removing the first or second fillers.

According to an aspect of the invention, a device manufacturing method, the method comprising, in a lithographic cell comprising a lithographic apparatus and a plurality of process apparatus:
filling first apertures in a first pattern in a first layer of radiation-sensitive material of a substrate with a first filler;
removing the first layer of radiation-sensitive material without removing the first filler;
applying a second layer of radiation-sensitive material around the first filler; and
exposing the second layer of radiation-sensitive material to an image corresponding to a second pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
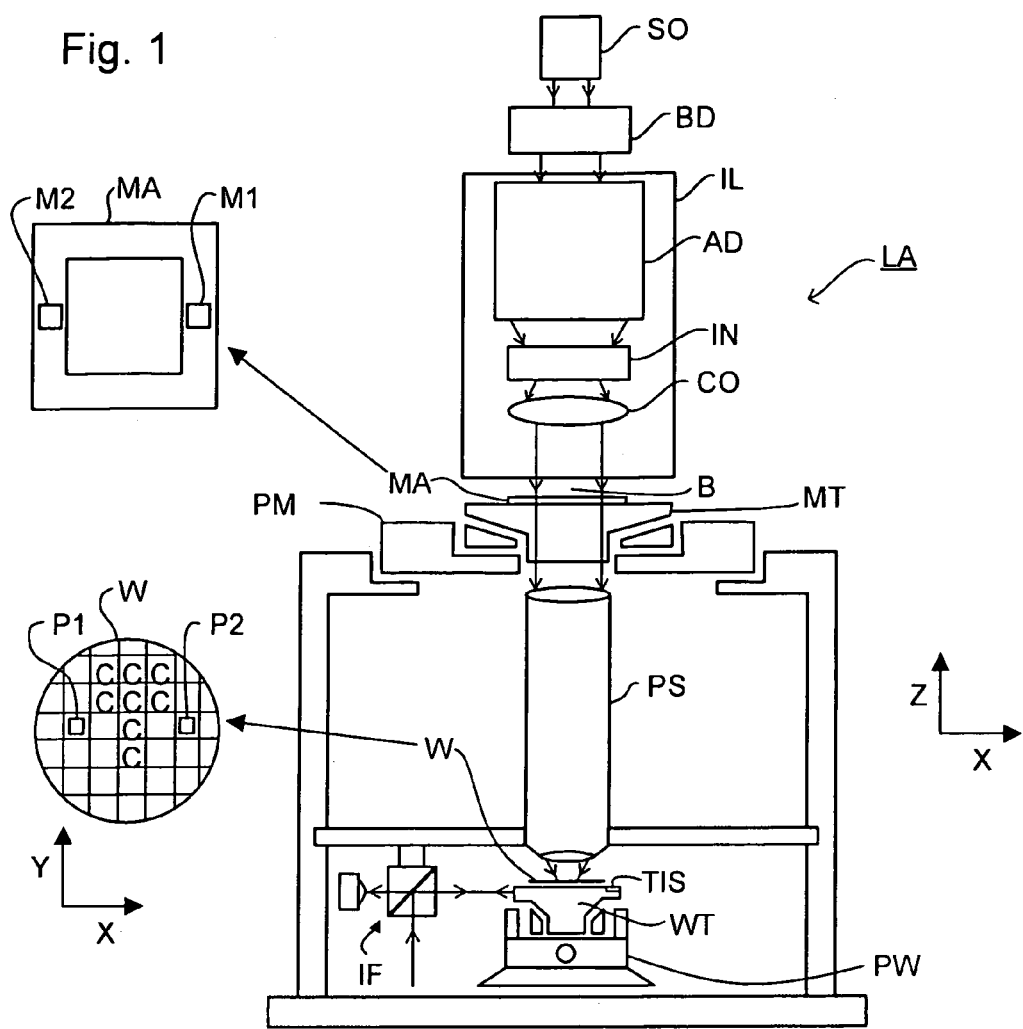
FIG. 1 depicts a lithographic apparatus according to an embodiment of the invention.
Figure 2:
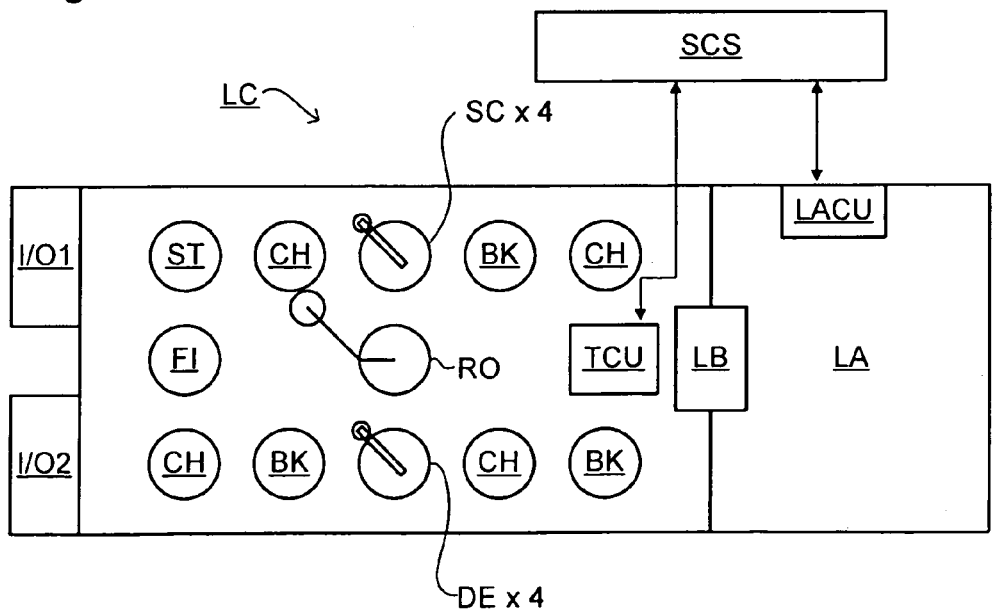
FIG. 2 depicts a lithographic cell including the apparatus of FIG. 1.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment markers M1, M2 and substrate alignment markers P1, P2. Although the substrate alignment markers as illustrated occupy dedicated target portions, they may be located in spaces between target portions (these are known as scribe-lane alignment markers). Similarly, in situations in which more than one die is provided on the patterning device MA, the patterning device alignment markers may be located between the dies. A beam characteristic or other measurement may be using a transmission image sensor TIS provided on the substrate table WT.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus LA forms part of a lithographic cell LC, also sometimes referred to a lithocell or lithocluster, which also includes apparatus to perform pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process apparatus and then delivers it to the loading bay LB of the lithographic apparatus. These devices, which are often collectively referred to as the track, are under the control of a track control unit TCU which is itself controlled by a supervisory control system SCS, which also controls the lithographic apparatus. The control unit may control, for example, the illuminator and the projection system to expose a substrate. Thus, the different apparatus may be operated to maximize throughput and processing efficiency.

According to an embodiment, the track is supplemented by a fill apparatus FI and a strip apparatus ST. The fill apparatus FI is arranged to coat a substrate with a layer of filler material that fills one or more apertures in the exposed and developed resist. The fill apparatus may be a spin coater of known type, for example, provided with a supply of a filler material, which may be selected from the group consisting of spin-on SiO2, spin-on silicon nitride, spin-on silicon oxynitride, and silicon polymer. A spin coater used to apply resist and provided as standard in a track may be used as the fill apparatus if connected to a supply of suitable material. A multi-purpose coater, connected to supplies of several different materials so as to apply a selected one of the materials to a substrate may also be used. Desirable properties of the filler material are that it should be easy to apply in layers of controllable thickness, should flow when applied to fill apertures in an exposed and developed resist layer and should be resistant to a method to remove the exposed and developed resist. For example, the filler may be substantially insoluble in a solvent used to dissolve the developed resist, or at least have a substantially lower solubility than the developed resist.

The strip apparatus ST may be a washing device connected to a supply of solvent or reagent that dissolves or reacts with the filler material so as to remove it without substantially affecting the underlying layer of the substrate. The strip apparatus may be a standard developer device adapted by connection to a supply of a suitable reagent or solvent. Again, a multi-purpose device may be used.

According to an embodiment of the invention, the above described lithographic cell is used to perform a double processing technique, as described below. It should be noted that the method described below may be performed on other apparatus, e.g. in which one or both of the strip and fill apparatus are not integrated into the track, but use of the above described apparatus may enable the method to be described to be performed with higher throughput and higher yield. Use of the above described apparatus may avoid the need for a substrate to be removed from the lithographic cell between exposures, hence reducing cycle time and ensuring greater uniformity between exposures. In particular substrate handling steps may be avoided.

Figure 3:
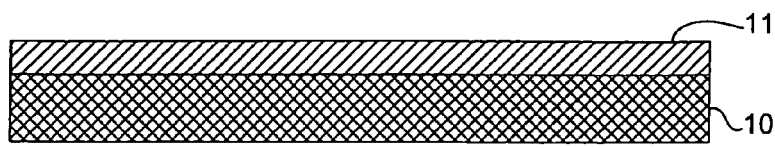
FIGS. 3 to 12 depict stages in a manufacturing method according to an embodiment of the invention.
Figure 4:
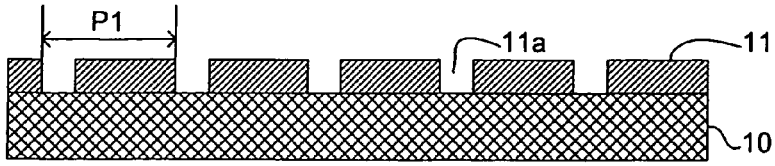
Figure 5:
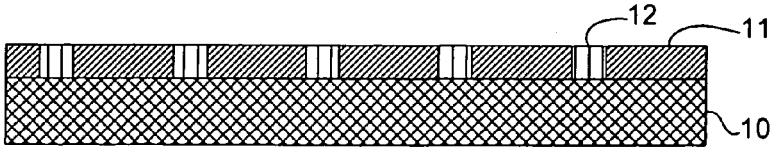

A double processing method according to an embodiment of the invention is described with reference to FIGS. 3 to 12, which are cross-sections through a substrate to which the method of the embodiment of the invention is applied. First a substrate 10, e.g. a silicon wafer, is coated with a first layer of radiation-sensitive material 11 (e.g. resist), as shown in FIG. 3. This is exposed and developed so as to form apertures 11a at a pitch P1, which is, in an embodiment, close to the minimum pitch imagable by the lithographic apparatus used, as shown in FIG. 4. If the resist is a positive tone resist, this step may be performed using a patterning device (e.g., mask) having bright features, e.g. lines or studs, on a dark background and developing away the illuminated parts of the resist.

Figure 6:
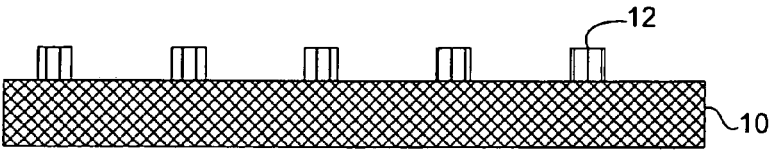
Figure 7:
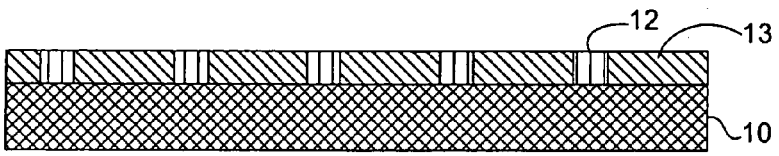

In a conventional double patterning technique, the substrate is then etched so that the resist pattern is transferred into the substrate. However, in the present embodiment, the apertures in the resist pattern are instead filled with a filler material 12 of the type described above as shown in FIG. 5. As shown in FIG. 6, the remaining parts of the first resist are removed, so that the first filler 12 forms islands or mesas, and a second layer of resist 13 is coated around them, as shown in FIG. 7. The first layer of resist cannot in general be re-used for a second exposure because it will retain the memory of having been exposed, it will be sub-threshold in places other than where the apertures 11a were formed and a second exposure would require too high a contrast to provide a useful process window.

Figure 8:
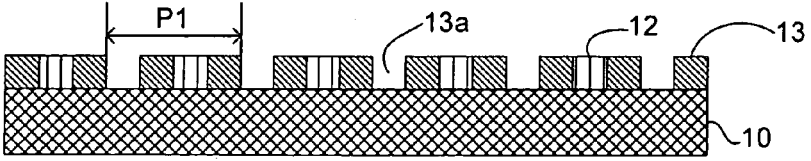

Following a second exposure and development step, the situation shown in FIG. 8 is reached: a second set of apertures 13a at pitch P1 are formed in the second resist layer interleaved with the first filler islands 12. The second exposure step may be performed with the same pattern as used for the first exposure, but with a positional offset, or may use a different pattern. The pitch P1 in FIG. 4 need not be same value as pitch P1 in FIG. 8. Further, although the Figures are drawn that way, it is not essential that the second apertures 13a are the same size as the first filler islands 12 nor need they be spaced equidistantly between first filler islands 12.

Figure 9:
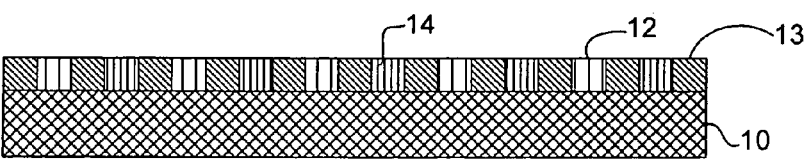
Figure 10:
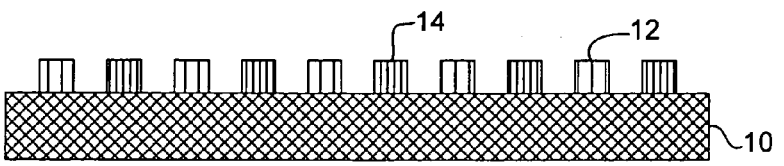
Figure 11:
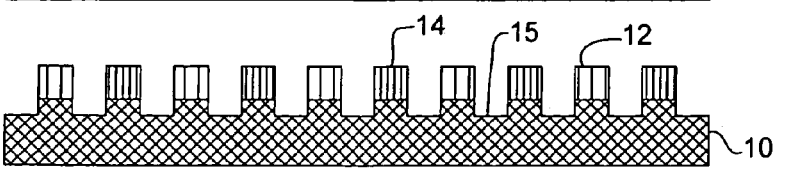
Figure 12:
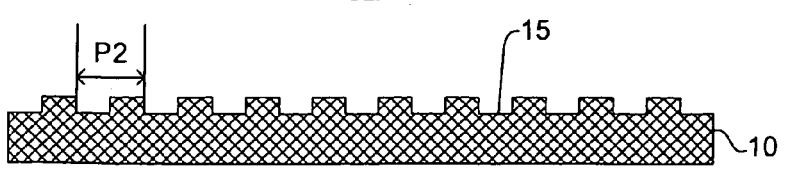

Next the second apertures 13a are filled with a second filler material 14 to reach the situation shown in FIG. 9. The second filler material may be the same as first filler material. Then, the second resist 13 is removed so that, as shown in FIG. 10, the first and second filler materials 12, 14 form islands spaced apart on top of the substrate 10. The final steps are then to transfer the pattern defined by the spaces between the first and second filler islands 12, 14 into the substrate 10, FIG. 11, and to remove the filler materials, FIG. 12. The pattern transfer step may be, for example, an etch to form recesses 15 in the substrate 10, or any other process that alters or adds to the substrate only in the spaces defined between the filler islands 12, 14. It will be seen, for example, that the features 15 formed by the pattern transfer step have a pitch P2 that is half the pitch P1 of the features defined in the imaging steps. Thus, features may be patterned with an effective $k_1$ value of less than 0.25 using two imaging steps with a $k_1$ value of greater than 0.25.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic cell, comprising:
a lithographic apparatus;
a process apparatus comprising a fill apparatus, or a strip apparatus, or both a fill apparatus and a strip apparatus;
a control unit configured to control both the lithographic apparatus and the process apparatus; the control unit comprising a storage medium having stored therein instructions to cause the lithographic cell to carry out a process comprising the steps of:
filling first apertures in a first pattern in a first layer of radiation-sensitive material of a substrate with a first filler;
removing the first layer of radiation-sensitive material without removing any of the first filler;
applying a second layer of radiation-sensitive material around the first filler; and
exposing the second layer of radiation-sensitive material to an image corresponding to a second pattern.

2. The lithographic cell of claim 1, wherein the fill apparatus is a spin coater.

3. The lithographic cell of claim 1, wherein the strip apparatus is a developer connected to a supply of solvent or reagent able to selectively remove a filler material.

4. The lithographic cell of claim 1, wherein the storage medium has stored therein further instructions to cause the lithographic cell to perform the steps of:
developing the second layer of radiation-sensitive material to form second apertures in the second pattern therein;
filling the second apertures with a second filler; and
removing the second layer of radiation-sensitive material without removing the first or second fillers.

5. The lithographic cell of claim 4, wherein the storage medium has stored therein further instructions to cause the lithographic cell to perform the steps of:
transferring a third pattern, defined by the areas of the substrate not covered by the first and second fillers, into the substrate; and
removing the first and second fillers.

6. The lithographic cell of claim 1, wherein the storage medium has stored therein further instructions to cause the lithographic cell to perform the steps of:
applying the first layer of radiation-sensitive material to the substrate; and
exposing and developing the first layer of radiation-sensitive material to form the first apertures in the first pattern therein.

7. The lithographic cell of claim 1, wherein the lithographic apparatus comprises: an illuminator configured to condition a beam of radiation;
a support structure configured to hold a patterning device, the patterning device configured to pattern the radiation beam;
a substrate table configured to hold a substrate; and
a projection system configured to project the patterned radiation beam onto a target portion of the substrate.

8. The lithographic cell of claim 7, wherein the control unit is configured to control the illuminator and the projection system to expose the substrate.

9. The lithographic cell of claim 1, comprising a spin coater as the fill apparatus and a developer as the strip apparatus.

10. A device manufacturing method using a lithographic apparatus, the method comprising:
- filling first apertures in a first pattern in a first layer of radiation-sensitive material of a substrate with a first filler;
- removing the first layer of radiation-sensitive material without removing the first filler;
- applying a second layer of radiation-sensitive material around the first filler;
- exposing and developing the second layer of radiation-sensitive material to form second apertures in a second pattern therein;
- filling the second apertures with a second filler; and
- removing the second layer of radiation-sensitive material without removing the first or second fillers.

11. The method of claim 10, further comprising:
- transferring a third pattern, defined by the areas of the substrate not covered by the first and second fillers, into the substrate; and
- removing the first and second fillers.

12. The method of claim 11, wherein the first pattern and the second pattern are interleaved so that the pitch of features in the third pattern is smaller than the pitches of features in the first and second patterns.

13. The method of claim 12, wherein transferring the third pattern into the substrate comprises etching the areas of the substrate not covered by the first and second fillers.

14. The method of claim 10, further comprising:
- applying a first layer of radiation-sensitive material to a substrate; and
- exposing and developing the first layer of radiation-sensitive material to form the first apertures in the first pattern therein.

15. The method of claim 10, wherein filling the first and second apertures comprises spin coating a filler material onto the substrate over the exposed and developed layer of radiation-sensitive material.

16. The method of claim 10, wherein the first filler and the second filler are formed of the same material.

17. A device manufacturing method, the method comprising, in a lithographic cell comprising a lithographic apparatus and a plurality of process apparatus:
- filling first apertures in a first pattern in a first layer of radiation-sensitive material of a substrate with a first filler;
- removing the first layer of radiation-sensitive material without removing any of the first filler;
- applying a second layer of radiation-sensitive material around the first filler; and exposing the second layer of radiation-sensitive material to an image corresponding to a second pattern.

18. The method of claim 17, further comprising:
- developing the second layer of radiation-sensitive material to form second apertures in the second pattern therein;
- filling the second apertures with a second filler; and
- removing the second layer of radiation-sensitive material without removing the first or second fillers.

19. The method of claim 18, further comprising:
- transferring a third pattern, defined by the areas of the substrate not covered by the first and second fillers, into the substrate; and
- removing the first and second fillers.

20. The method of claim 17, further comprising:
- applying the first layer of radiation-sensitive material to the substrate; and
- exposing and developing the first layer of radiation-sensitive material to form the first apertures in the first pattern therein.

* * * * *

UNITED STATES PATENT AND TRADEMARK OFFICE
CERTIFICATE OF CORRECTION

PATENT NO. : 7,646,468 B2
APPLICATION NO. : 11/396915
DATED : January 12, 2010
INVENTOR(S) : Stefan Geerte Kruiswijk It is certified that error appears in the above-identified patent and that said Letters Patent is hereby corrected as shown below:

In claim 10, line 12, column 9, please insert --any of-- after the word "removing".

Signed and Sealed this

Thirtieth Day of March, 2010

David J. Kappos
*Director of the United States Patent and Trademark Office*